(12) United States Patent
He et al.

(10) Patent No.: US 12,720,788 B2
(45) Date of Patent: Aug. 25, 2026

(54) SEMICONDUCTOR DEVICE AND METHOD FOR MANUFACTURING THE SAME

(71) Applicant: INNOSCIENCE (SUZHOU) TECHNOLOGY CO., LTD., Suzhou City (CN)

(72) Inventors: Chuan He, Suzhou City (CN); Ronghui Hao, Suzhou City (CN); King Yuen Wong, Suzhou City (CN)

(73) Assignee: INNOSCIENCE (SUZHOU) TECHNOLOGY CO., LTD., Suzhou City (CN)

( * ) Notice: Subject to any disclaimer, the term of this patent is extended or adjusted under 35 U.S.C. 154(b) by 1265 days.

(21) Appl. No.: 17/437,426

(22) PCT Filed: Aug. 19, 2021

(86) PCT No.: PCT/CN2021/113411
§ 371 (c)(1),
(2) Date: Feb. 23, 2023

(87) PCT Pub. No.: WO2023/019496
PCT Pub. Date: Feb. 23, 2023

(65) Prior Publication Data

US 2024/0021715 A1 Jan. 18, 2024

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 62/8503* (2025.01); *H10D 64/251* (2025.01)

(58) Field of Classification Search
CPC ............... H10D 30/475; H10D 30/015; H10D 62/8503; H10D 64/251
See application file for complete search history.

(56) References Cited

U.S. PATENT DOCUMENTS 6,275,095 B1 8/2001 Hoshino et al.
10,741,682 B2 * 8/2020 Jeon .................. H10D 30/4755
(Continued)

FOREIGN PATENT DOCUMENTS

CN 102386875 A 3/2012
CN 105190866 A 12/2015
(Continued)

OTHER PUBLICATIONS

International Search Report and Written Opinion of the corresponding PCT application No. PCT/CN2021/113411 mailed on May 17, 2022.

*Primary Examiner* — Jay C Kim
*Assistant Examiner* — Woo K Lee
(74) *Attorney, Agent, or Firm* — Li & Cai Intellectual Property (USA) Office

(57) ABSTRACT

A nitride-based semiconductor circuit includes a nitride-based semiconductor carrier, a first nitride-based semiconductor layer, a second nitride-based semiconductor layer, connectors, a connection line, and a power supply line. The first nitride-based semiconductor layer is disposed over the nitride-based semiconductor carrier. The second nitride-based semiconductor layer is disposed on the first nitride-based semiconductor layer. The connectors are disposed on the second nitride-based semiconductor layer. The connection line electrically connects to one of the connectors. The power supply line electrically to the nitride-based semiconductor carrier. A heterojunction is formed between the first and the second nitride-based semiconductor layers. A potential difference is applied between the power supply line and the connection line.

20 Claims, 18 Drawing Sheets

(51) Int. Cl.

| | |
|---|---|
| ***H10D 62/85*** | (2025.01) |
| ***H10D 64/23*** | (2025.01) |

(56) References Cited

U.S. PATENT DOCUMENTS

| | | | | |
|---|---|---|---|---|
| 2007/0228401 | A1* | 10/2007 | Machida | H10D 30/6738<br>257/E29.253 |
| 2007/0228477 | A1* | 10/2007 | Suzuki | H10D 84/01<br>257/E27.012 |
| 2013/0221368 | A1* | 8/2013 | Oraw | H05B 45/20<br>257/89 |
| 2013/0240901 | A1* | 9/2013 | Kohda | H10D 62/8503<br>257/76 |
| 2018/0026099 | A1* | 1/2018 | Miyamoto | H10D 62/378<br>257/77 |

FOREIGN PATENT DOCUMENTS

| | | | |
|---|---|---|---|
| CN | 111834443 | A | 10/2020 |
| CN | 112771677 | A | 5/2021 |

* cited by examiner 100A
102
103
101
110
141
142
150
130
120
113
112
111
140
160
161
162

100D

SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device with a potential difference between a substrate and a connector.

BACKGROUND

In recent years, high-electron-mobility transistors (HEMTs) researches are prevalent in developments in semiconductor technologies and devices such as high-power switching and high-frequency applications. The HEMT utilizes a heterojunction interface between two materials having different bandgaps, and electrons are accumulated at the interface and form a two-dimensional electron gas (2DEG) region, which satisfies demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HMET devices, thereby making them suitable for mass production.

SUMMARY OF THE DISCLOSURE

In accordance with one aspect of the present disclosure, a nitride-based semiconductor circuit is provided. A nitride-based semiconductor circuit includes a nitride-based semiconductor carrier, a first nitride-based semiconductor layer, a second nitride-based semiconductor layer, connectors, a connection line, and a power supply line. The first nitride-based semiconductor layer is disposed over the nitride-based semiconductor carrier. The second nitride-based semiconductor layer is disposed on the first nitride-based semiconductor layer. The connectors are disposed on the second nitride-based semiconductor layer. The connection line electrically connects to one of the connectors. The power supply line electrically connects to the nitride-based semiconductor carrier. A heterojunction is formed between the first and the second nitride-based semiconductor layers. A potential difference is applied between the power supply line and the connection line.

In accordance with another aspect of the present disclosure, a nitride-based semiconductor circuit is provided. A nitride-based semiconductor circuit includes a substrate, a third nitride-based semiconductor layer, a first nitride-based semiconductor layer, a second nitride-based semiconductor layer, a connector, a connection line, and a power supply line. The third nitride-based semiconductor layer is disposed on the substrate. The first nitride-based semiconductor layer is disposed on the third nitride-based semiconductor layer. The second nitride-based semiconductor layer is disposed on the first nitride-based semiconductor layer. The connector is disposed on the second nitride-based semiconductor layer. The connection line is electrically connected to the connector. The power supply line is electrically connected to the substrate. The third nitride-based semiconductor layer is doped with p-type dopant. The first and third nitride-based semiconductor layers form one or more parasitic diodes. The power supply line is electrically connected to negative voltage, and the connection line is electrically connected to positive voltage.

In accordance with one aspect of the present disclosure, a manufacturing method of nitride-based semiconductor circuit is provided. The method includes steps as follows. Providing a nitride-based semiconductor carrier; disposing a first nitride-based semiconductor layer on the nitride-based semiconductor carrier; disposing a second nitride-based semiconductor layer on the first nitride-based semiconductor layer; disposing connectors on the second nitride-based semiconductor layer; electrically connecting one of the connectors with a connection line; electrically connecting the nitride-based semiconductor carrier with a power supply line; and applying a potential differential difference between the power supply line and the connection line. A heterojunction is formed between the first and the second nitride-based semiconductor layers.

By the above configuration, the potential difference or the potential differential difference in the nitride-based semiconductor circuit can reduce the dynamic resistance-on peak and issue caused by dynamic resistance-on peak, and, therefore, yield of manufacturing the nitride-based semiconductor circuit can be improved.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

Figure 8:
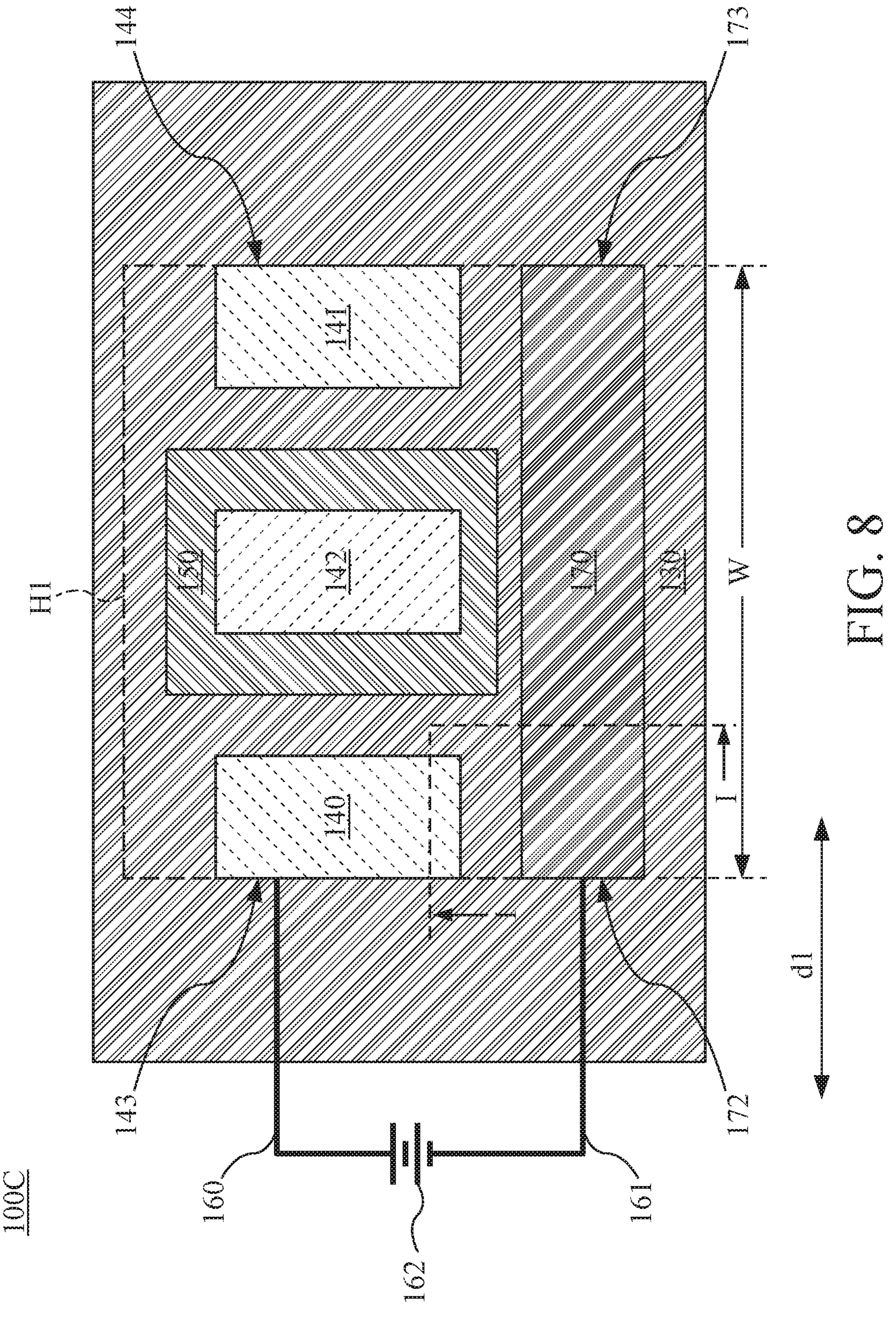
Figure 9:
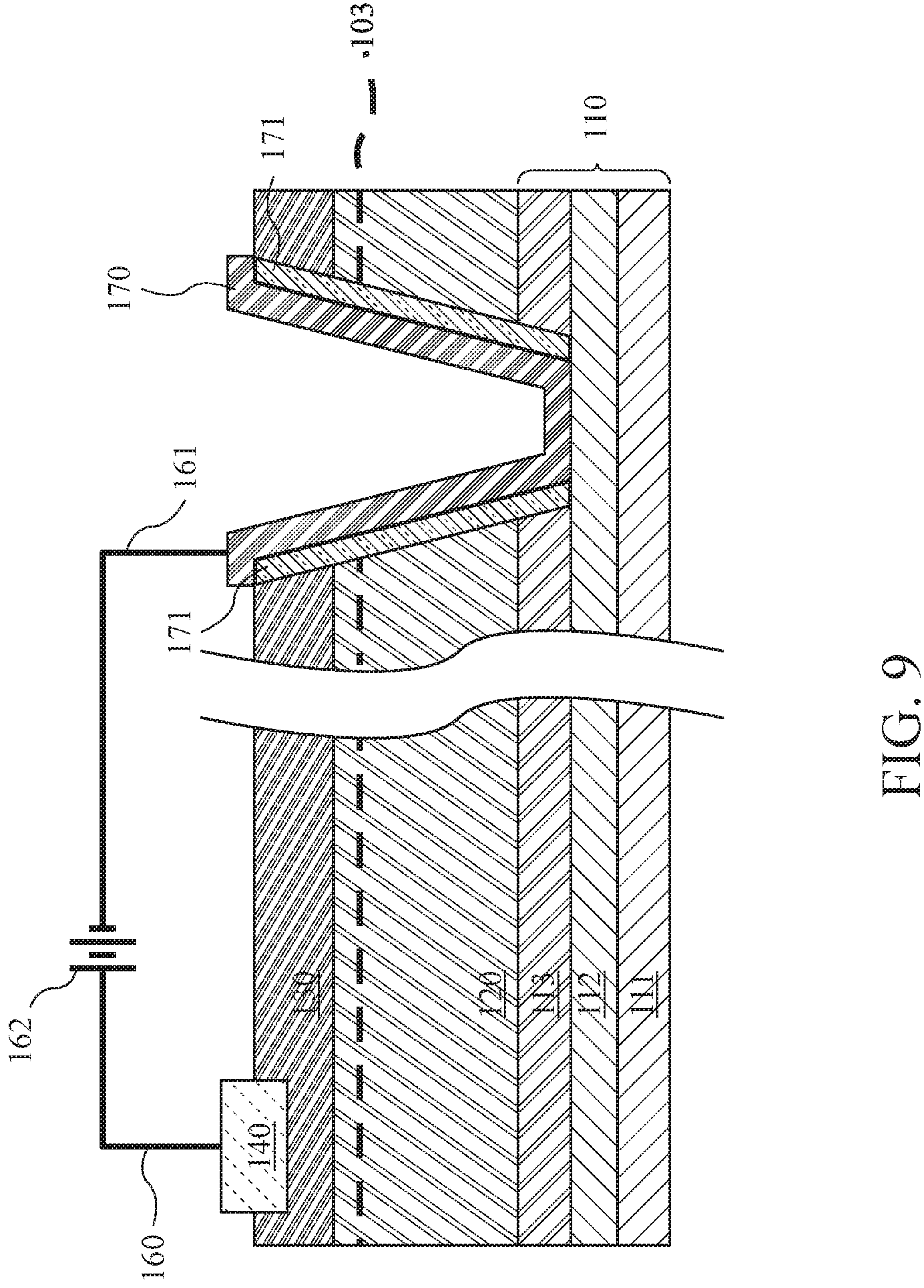
Figure 10:
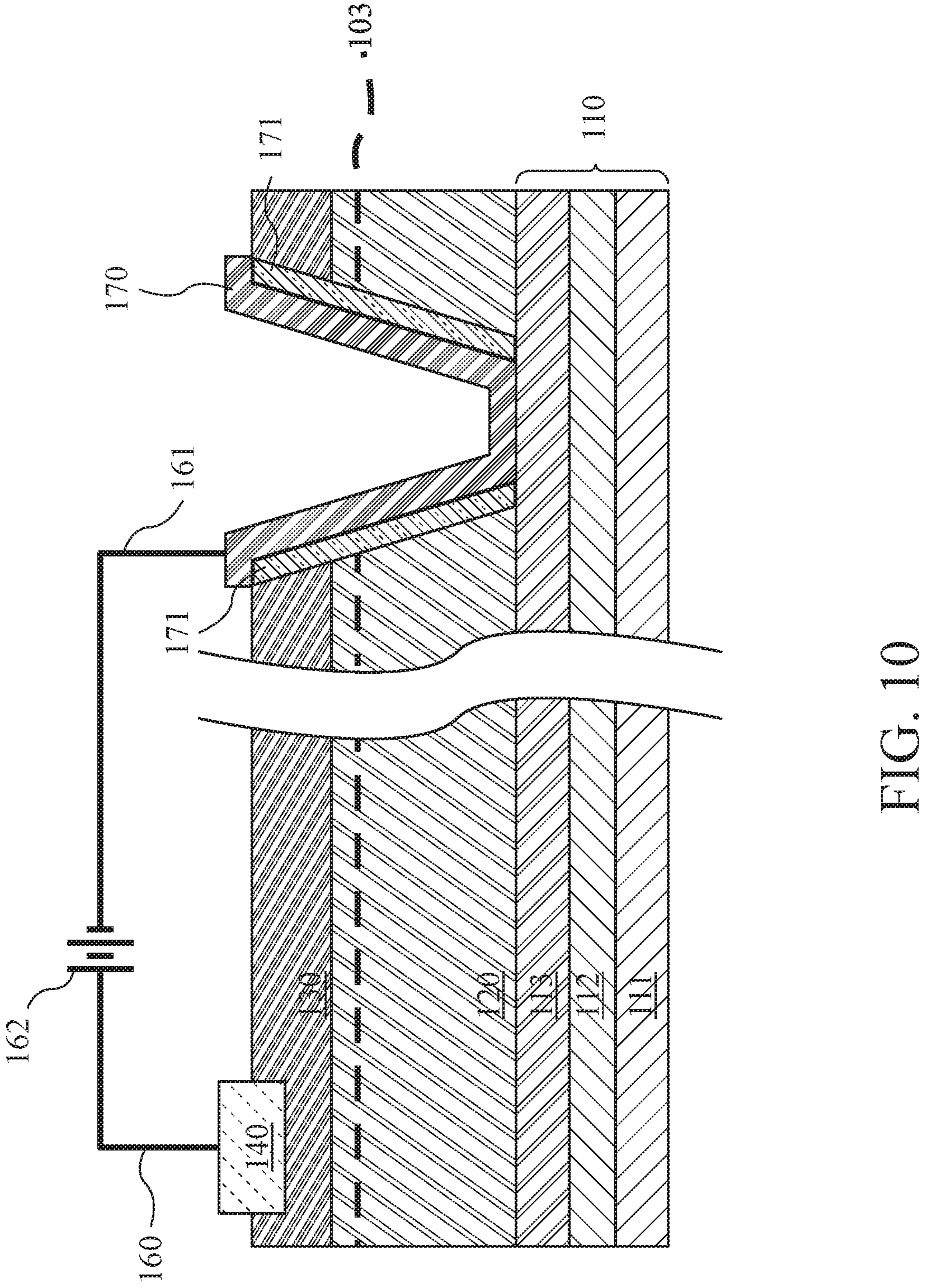
Figure 11:
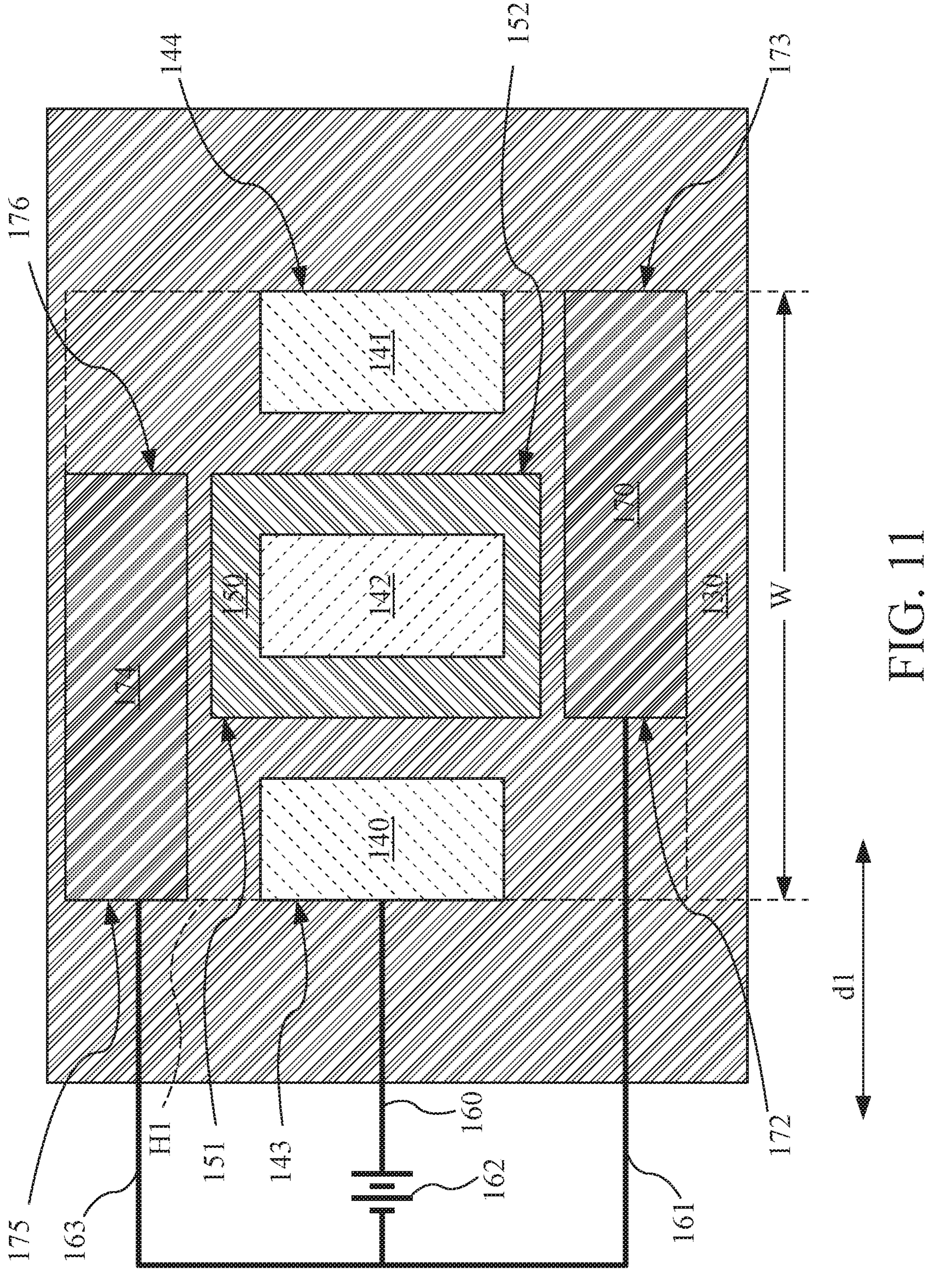
Figure 12:
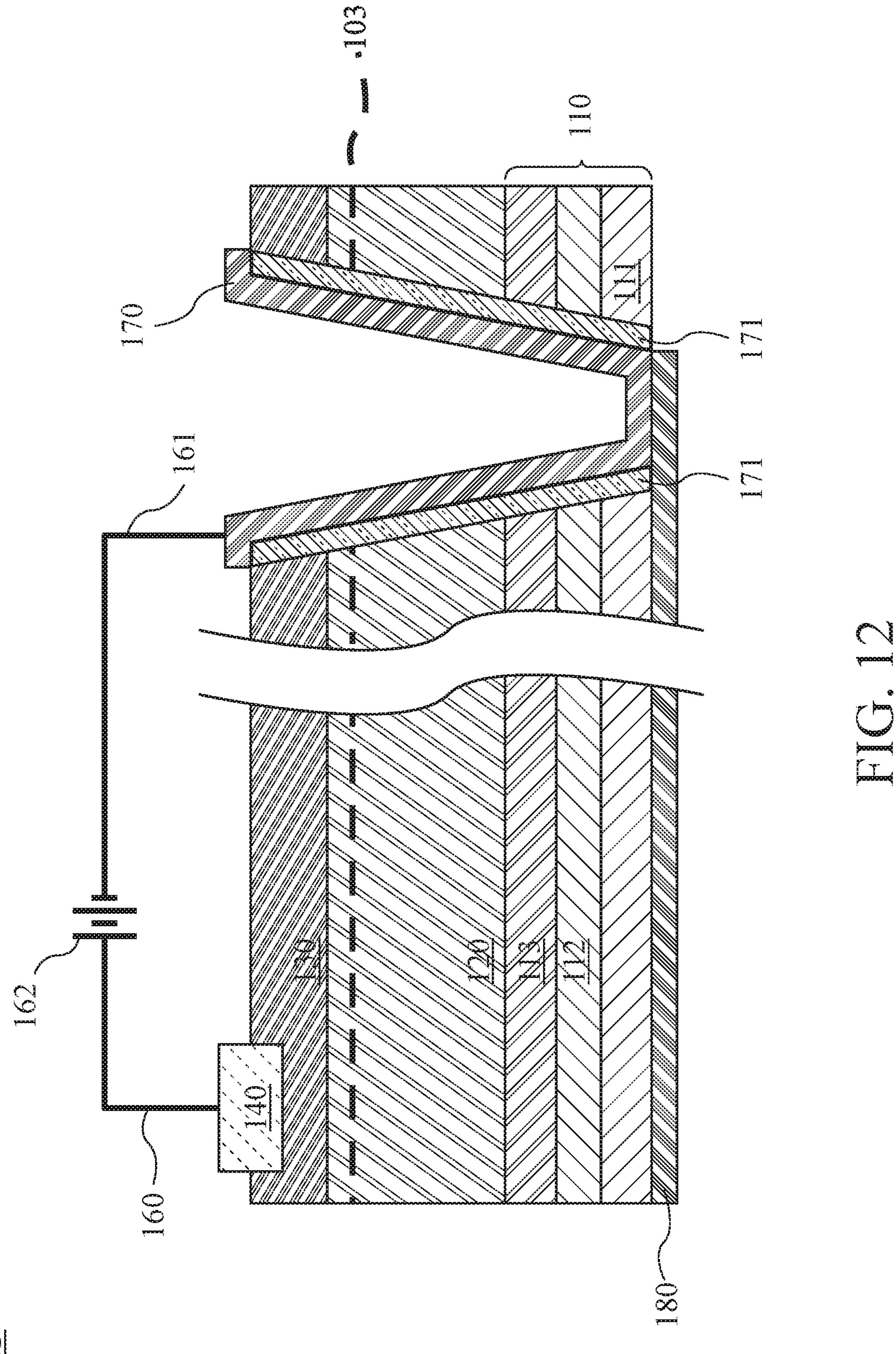
Figure 13:
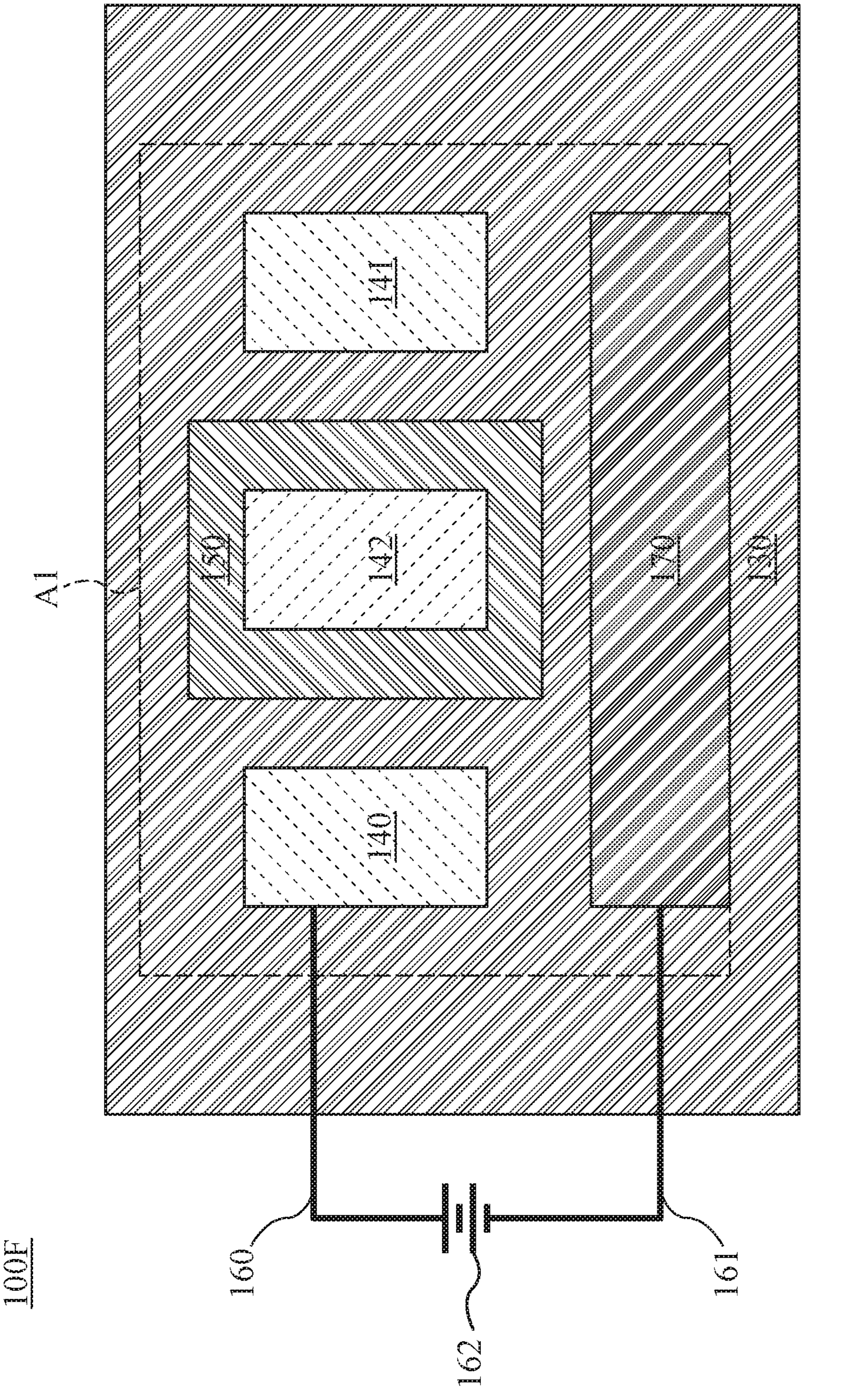
Figure 14:
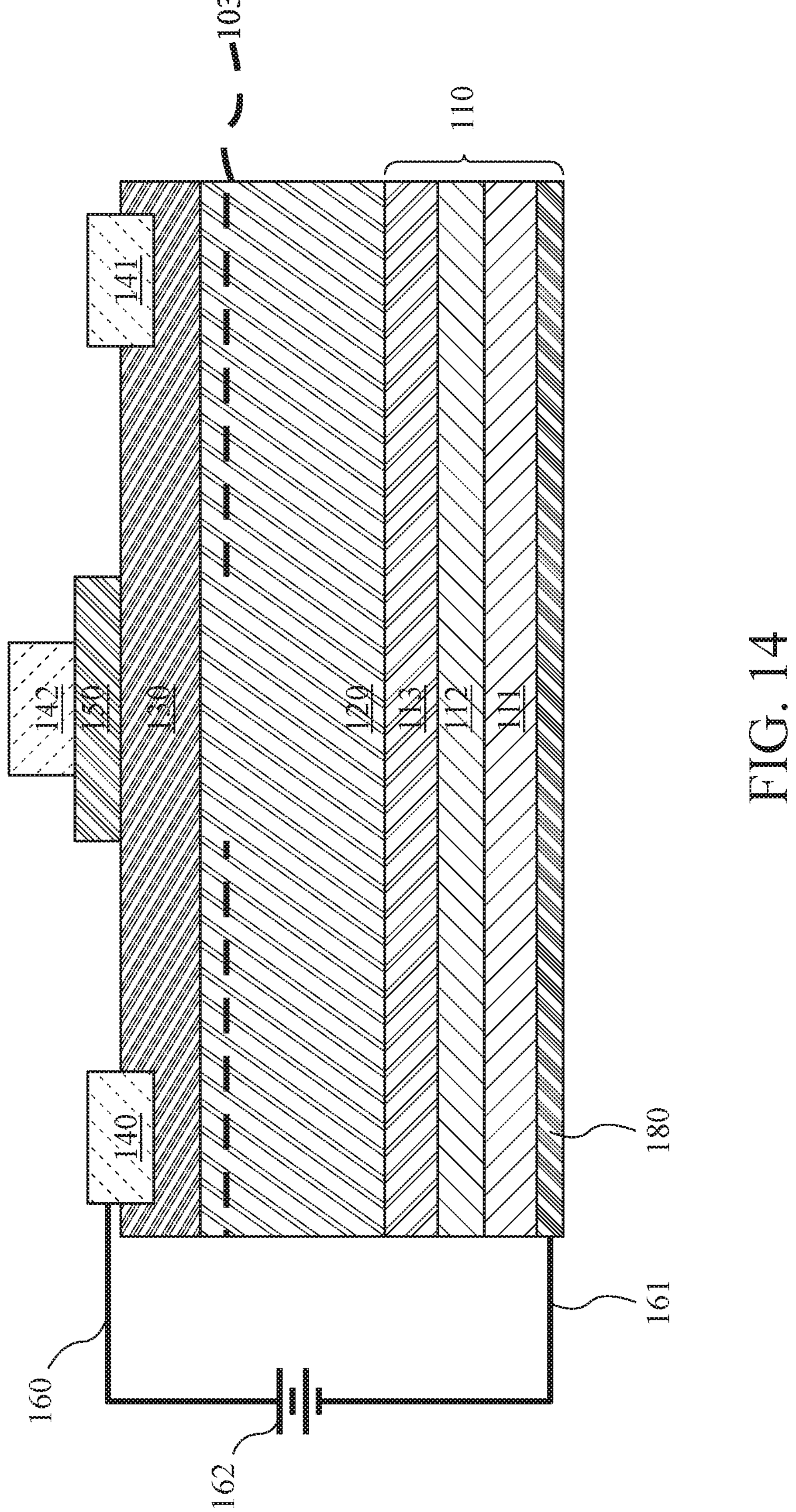
Figure 15:
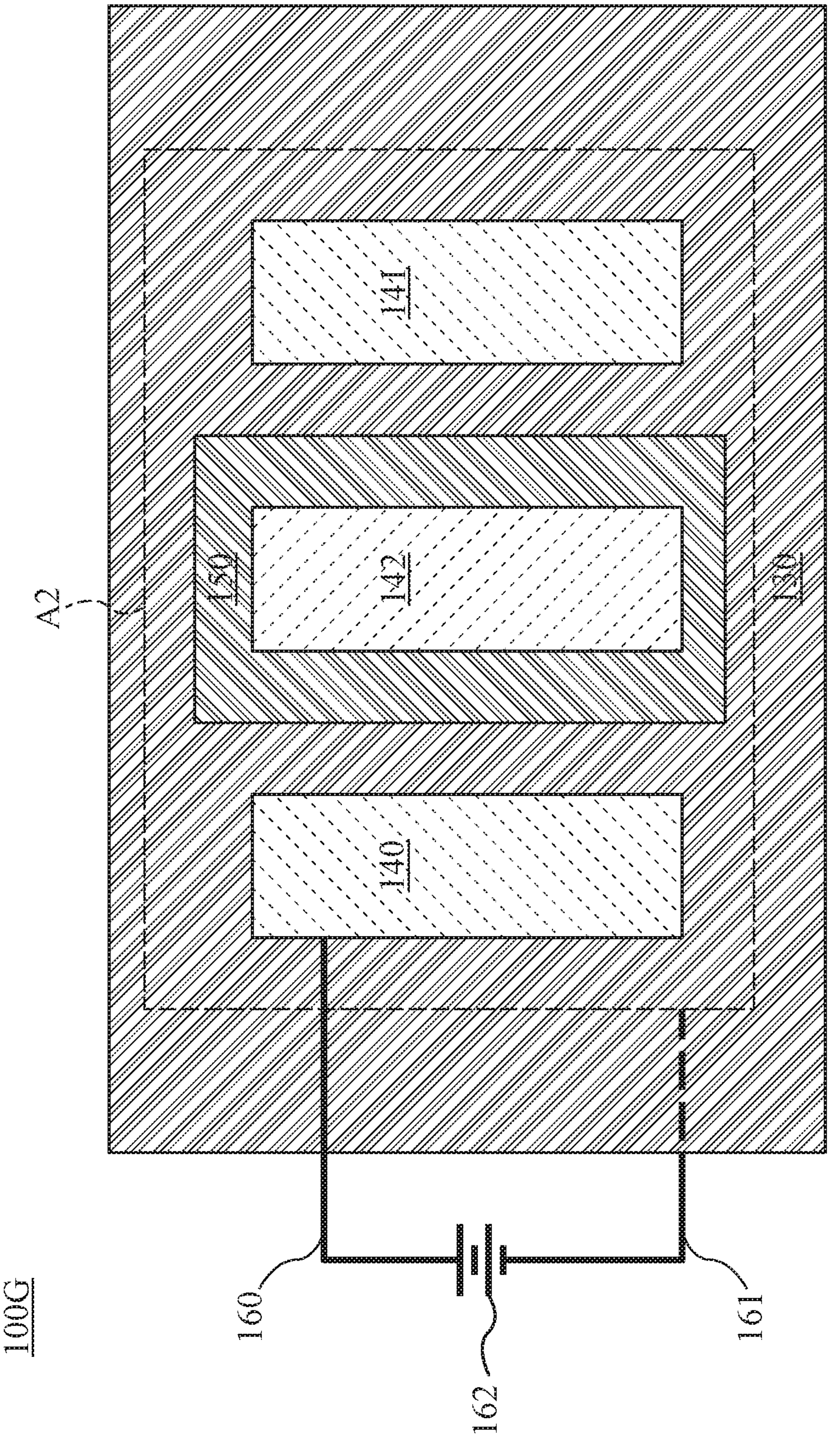
Figure 16:
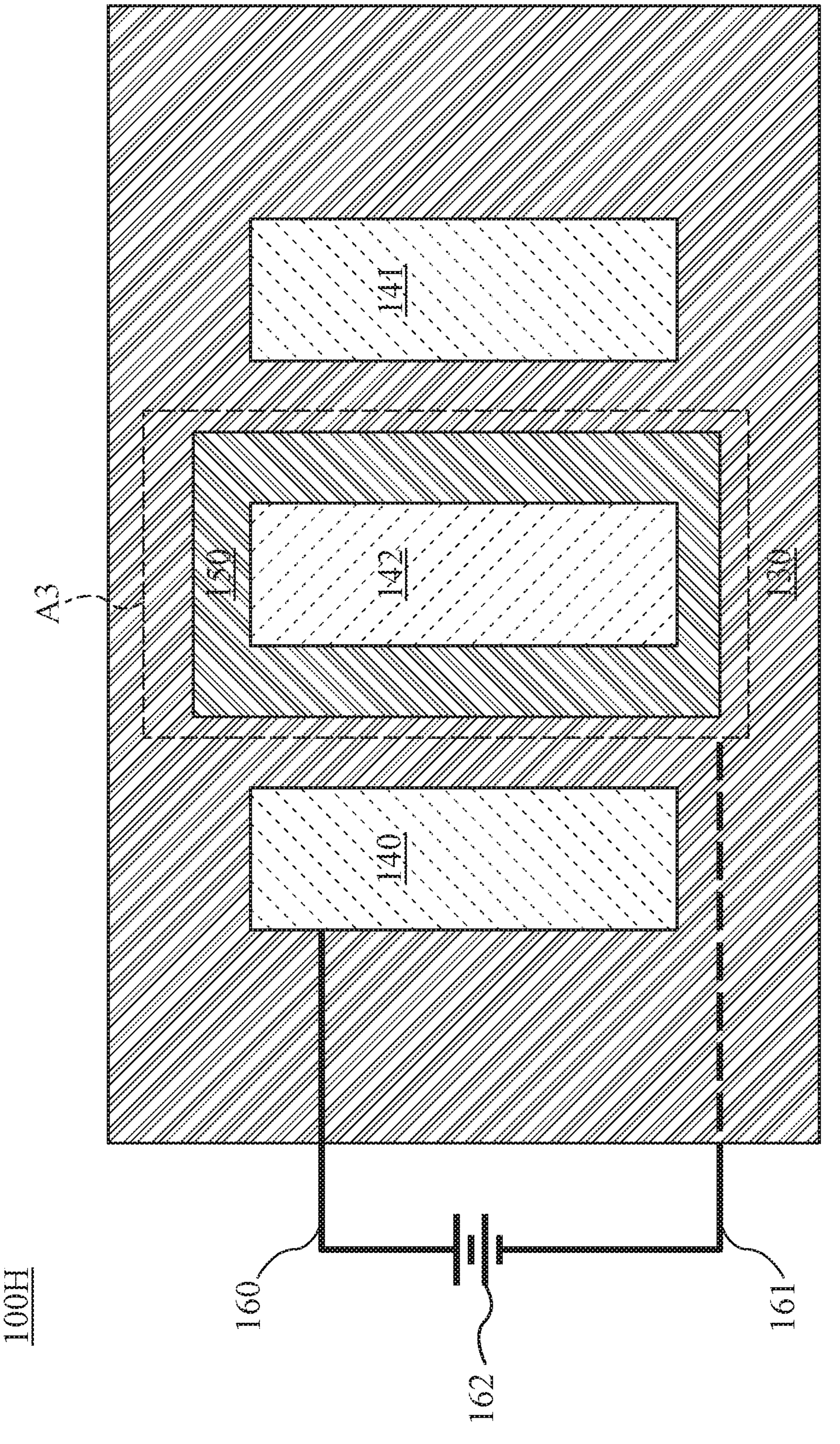
Figure 17:
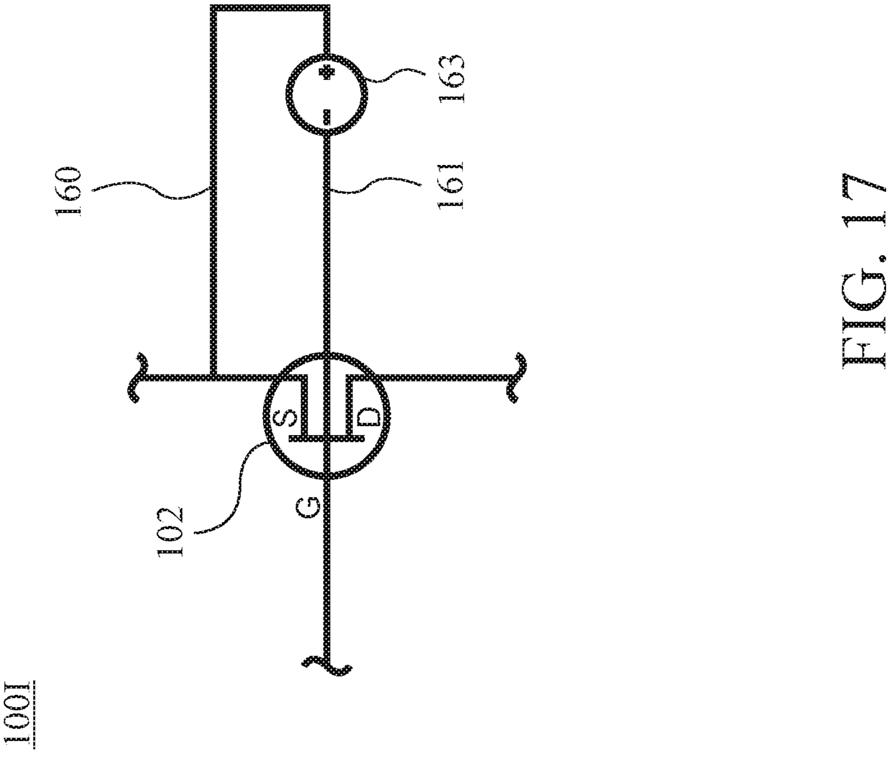
Figure 18:
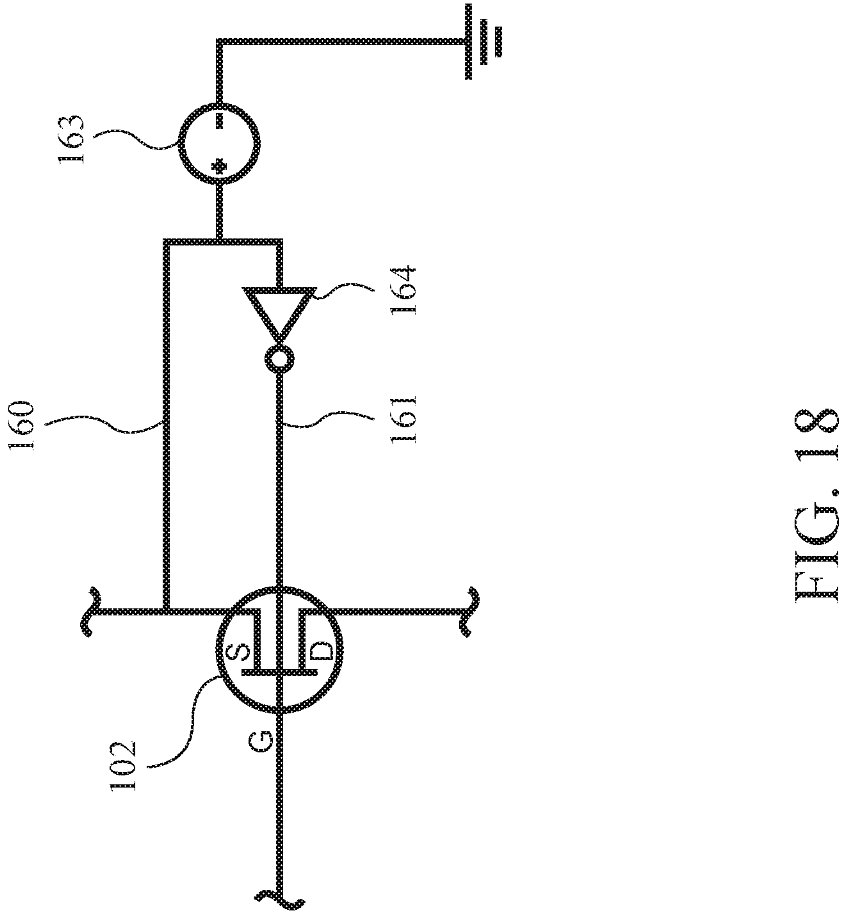

FIG. depicts a side sectional view of a nitride-based semiconductor circuit in another embodiment of the present invention;

FIG. 8 depicts a top view of a nitride-based semiconductor circuit in another embodiment of the present invention;

FIG. 9 depicts a side sectional view of a nitride-based semiconductor circuit in another embodiment of the present invention;

FIG. 10 depicts a side sectional view of a nitride-based semiconductor circuit in another embodiment of the present invention;

FIG. 11 depicts a top view of a nitride-based semiconductor circuit in another embodiment of the present invention;

FIG. 12 depicts a side sectional view of a nitride-based semiconductor circuit in another embodiment of the present invention;

FIG. 13 depicts a top view of a nitride-based semiconductor circuit in another embodiment of the present invention;

FIG. 14 depicts a side sectional view of a nitride-based semiconductor circuit in another embodiment of the present invention;

FIG. 15 depicts a top view of a nitride-based semiconductor circuit in another embodiment of the present invention;

FIG. 16 depicts a top view of a nitride-based semiconductor circuit in another embodiment of the present invention;

FIG. 17 depicts a circuit diagram of a nitride-based semiconductor circuit in another embodiment of the present invention; and FIG. 18 depicts a circuit diagram of a nitride-based semiconductor circuit in another embodiment of the present invention.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1:
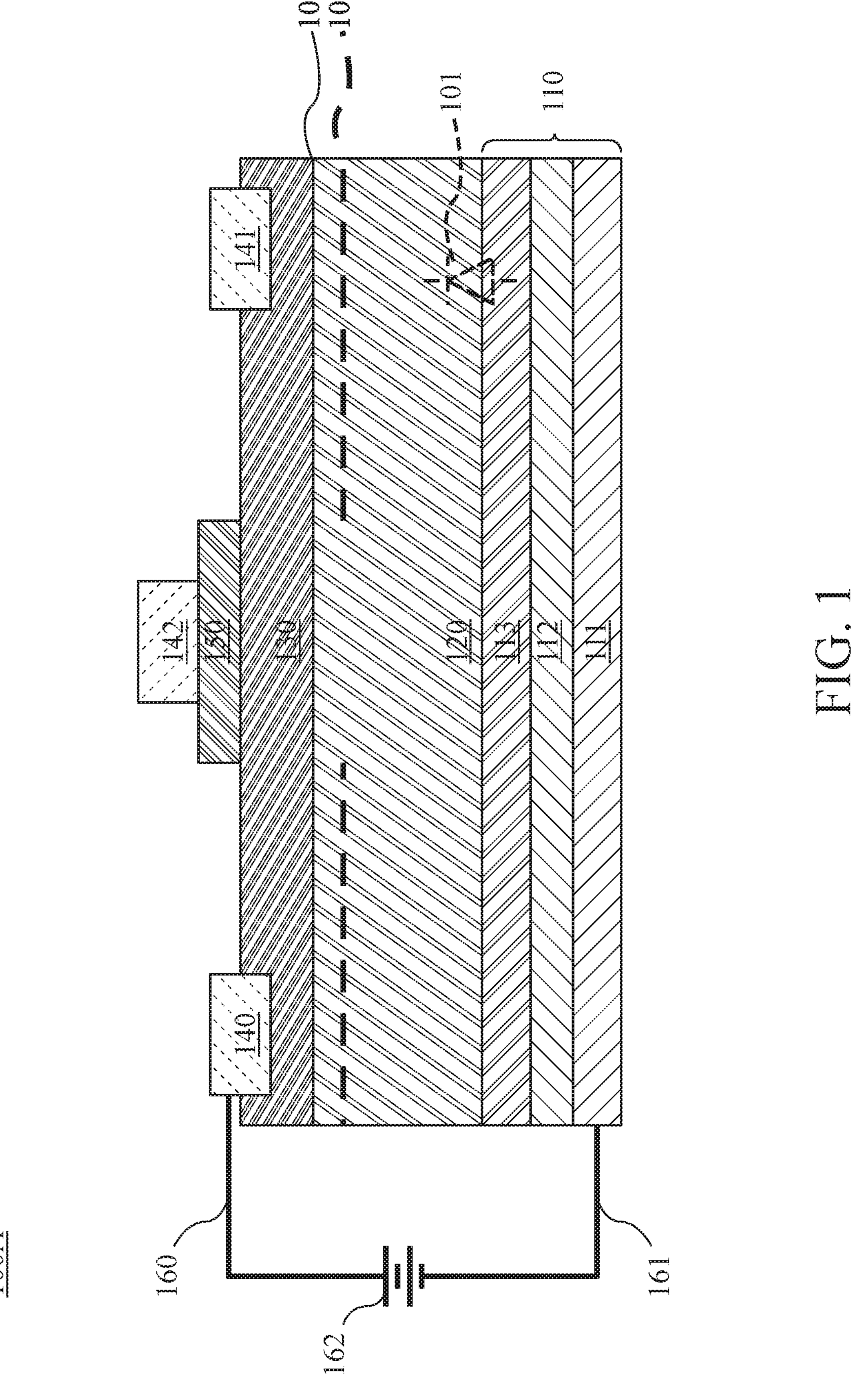
FIG. 1 depicts a side sectional view of a nitride-based semiconductor circuit in an embodiment of the present invention.

FIG. 1 shows the side sectional view of a nitride-based semiconductor circuit 100A in accordance with an embodiment. The nitride-based semiconductor circuit 100A includes a nitride-based semiconductor carrier 110, a nitride-based semiconductor layer 120, a nitride-based semiconductor layer 130, a connector 140, a connector 141, a connector 142, a connection line 160, and a power supply line 161.

The nitride-based semiconductor layer 120 is disposed over the nitride-based semiconductor carrier 110, and the nitride-based semiconductor layer 130 is disposed on the nitride-based semiconductor layer 120. A heterojunction 102 is formed between the nitride-based semiconductor layers 120 and 130.

In other words, a heterostructure is formed by growing the nitride-based semiconductor layer 130 onto the nitride-based semiconductor layer 120. Energy gaps of the material of the nitride-based semiconductor layer 120 and the material of the nitride-based semiconductor layer 130 are different. Because of the different energy gaps of these two materials, an energy discontinuity will appear in the band diagram. Two-dimensional electron gas (2DEG) 103 is accumulated in the potential well formed at the nitride-based semiconductor layers 120, 130 interface.

Connectors 140, 141, and 142 are disposed on the nitride-based semiconductor layer 130. To be specific, the connector 142 is located between the connector 140 and the connector 141. In this embodiment, the connector 140 can be a source connector, for example, and the connector 141 and the connector 142 can serve as a drain connector and a gate connector respectively. The nitride-based semiconductor circuit 100A form a HEMT structure, and the HEMT structure includes the connectors 140, 141, and 142, the nitride-based semiconductor layers 130, and 120, the nitride-based semiconductor carrier 110, and a nitride-based semiconductor layer 150.

In some embodiments, the connectors 140, 141, and 142 can include, for example but are not limited to, metals, alloys, doped semiconductor materials (such as doped crystalline silicon), compounds such as silicide and nitrides, other conductive materials, or combinations thereof. The exemplary materials of the connectors 140, 141, and 142 can include, for example but are not limited to, Ti, AlSi, TiN, or combinations thereof. The connectors 140, 141 and 142 may be a single layer, or plural layers of the same or different composition. In some embodiments, the connectors 140 and 141 form ohmic contacts with the nitride-based semiconductor layer 130; therefore, the connectors 140 and 141 can be served as the contact electrodes. The ohmic contacts can be achieved by applying Ti, Al, or other suitable materials to the connectors 140 and 141. In some embodiments, each of the connectors 140, 141, and 142 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

In this embodiment, the connection line 160 is electrically connected to the connector 140, and the power supply line 161 is electrically connected to the nitride-based semiconductor carrier 110. In the nitride-based semiconductor circuit 100A, a potential difference is applied between the power supply line 161 and the connection line 160. To be specific, the power supply line 161 electrically connects a substrate 111 of the nitride-based semiconductor carrier 110 to negative voltage or low voltage, and the connection line 160 electrically connects the connector 140 to positive voltage or high voltage, and a potential difference is applied between the power supply line 161 and the connection line 160.

In the nitride-based semiconductor circuit 100A, one or more parasitic diodes 101 are formed between the nitride-based semiconductor layer 120 and the nitride-based semiconductor carrier 110. While the power supply line 161 connects the negative voltage or low voltage to the nitride-based semiconductor carrier 110, and the connection line 160 connects the positive voltage or high voltage to the source connector 140, the parasitic diode 101 is not biased or slightly reverse biased, and depletion issue caused by the parasitic diode 101 can be overcame. In other words, the nitride-based semiconductor carrier 110 has a nitride-based semiconductor layer 113. The parasitic diode 101 form by the nitride-based semiconductor layer 113 and the nitride-based semiconductor layer 120 is in the range where the potential difference is applied. For example, the connector 141 may be the drain connector, and the power supply line 161 provides a negative voltage while the connector 141 is at high voltage, and the parasitic diode 101 is not biased or slightly reverse biased.

In this embodiment, the nitride-based semiconductor layer 120 includes gallium nitride (GaN), and the nitride-based semiconductor layer 130 includes aluminum gallium nitride (AlGaN). However, the exemplary materials of the nitride-based semiconductor layers 120, 130 can include, for example but are not limited to, nitrides or group III-V compounds, such as GaN, AlN, InN, $In_xAl_yGa_{(1-x-y)}N$ where $x+y\leq 1$, and $Al_yGa_{(1-y)}N$ where $y\leq 1$.

The nitride-based semiconductor layer 120 is grown on the nitride-based semiconductor layer 113, and the parasitic diode 101 is formed. The nitride-based semiconductor layer 113 of the nitride-based semiconductor carrier 110, which is adjacent to the nitride-based semiconductor layer 120, may include GaN and p-type dopant. For example, the p-type dopant can be carbon. The nitride-based semiconductor layer 120 is an undoped layer, and the nitride-based semiconductor layer 113 carries the nitride-based semiconductor layer 120 and doped with p-type dopant, and, therefore, the parasitic diode 101 may be formed.

To be specific, the nitride-based semiconductor carrier 110 of the nitride-based semiconductor circuit 100A includes a substrate 111, a buffer layer 112, and the nitride-based semiconductor layer 113. The buffer layer 112 is disposed on the substrate 111. The nitride-based semiconductor layer 113 is disposed on the buffer layer 112.

For example, the substrate 111 may include silicon (Si), sapphire ($Al_2O_3$), and silicon carbide (SiC). The buffer layer 112 between the substrate 111 and the nitride-based semiconductor layer 113 provides strain management. For example, the buffer layer 112 may include appropriate AlN, graded AlGaN buffer layers, or AlN/GaN superlattices.

The nitride-based semiconductor layer 113 is doped with p-type dopant. In this embodiment, the nitride-based semiconductor layer 113 is a GaN layer doped with carbon, and the nitride-based semiconductor layer 113 can insulate the nitride-based semiconductor layer 120 from the substrate 111.

As previously mentioned, the nitride-based semiconductor layer 120 is growth on the nitride-based semiconductor layer 113, and the nitride-based semiconductor layer 120 is a not-intentionally doped GaN layer. Therefore, the nitride-based semiconductor layers 120, 113 may form one or more parasitic diode 101.

The power supply line 161 is electrically connected to the substrate 111. To be specific, the power supply line 161 connects the substrate 111 and a negative voltage of a power supply 162. In other words, the power supply line 161 may connect to a cathode, negative terminal or electrode of a battery, or any proper kinds of electrical devices that supplies electric power.

The connection line 160 is electrically connected to the connector 140. To be specific, the connection line 160 connects the connector 140 and a positive voltage from the power supply 162. In other words, the connection line 160 may connect to an anode, positive terminal or electrode of the battery, or any proper kinds of electrical devices that supplies electric power.

The connectors 140~142 of the nitride-based semiconductor circuit 100A are located on the nitride-based semiconductor layer 130. The nitride-based semiconductor circuit 100A of the embodiment further includes the nitride-based semiconductor layer 150, and the connector 142 is disposed on the nitride-based semiconductor layer 150.

The nitride-based semiconductor layer 150 includes p-type dopant. The introduction of the nitride-based semiconductor layer 150 on top of the nitride-based heterostructure (i.e., nitride-based semiconductor layers 120, 130) raises the conduction band of the nitride-based semiconductor layer 130 above the Fermi level of an amount of energy comparable with the band gap of GaN in the nitride-based semiconductor layer 120, with the consequent depletion of the 2DEG 103.

For example, the p-type dopant of the nitride-based semiconductor layer 150 may include Magnesium (Mg) or others suitable dopant. With the potential difference applied, proper depletion is mainly corresponded to the nitride-based semiconductor layer 150 in the nitride-based semiconductor circuit 100A, and no parasitic diode 101 can affect the 2DEG 103.

Different stages of a manufacturing method of nitride-based semiconductor circuit 100A are shown in FIG. 2, FIG. 3, FIG. 4 and FIG. 5, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2:
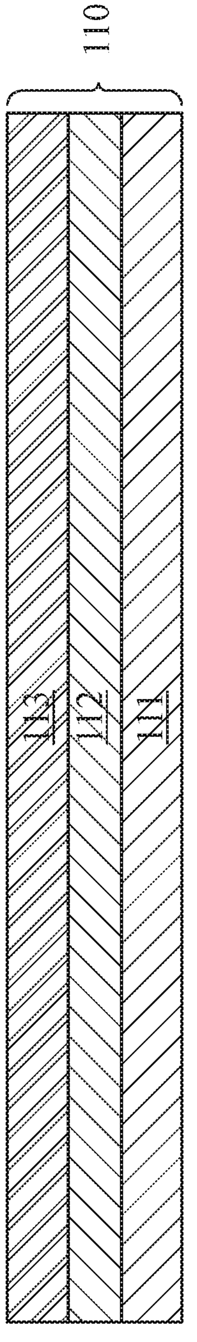
FIG. 2 depicts a side sectional view of a stage of a manufacturing method of nitride-based semiconductor circuit in an embodiment of the present invention.

Referring to FIG. 2, the manufacturing method of the nitride-based semiconductor circuit 100A provides a nitride-based semiconductor carrier 110.

The nitride-based semiconductor circuit 100A has the substrate 111, the nitride-based semiconductor layer 113 and the buffer layer 112 in-between. The substrate 111 may include sapphire, silicon, and silicon carbide, and the buffer layer 112 between the substrate 111 and the nitride-based semiconductor layer 113 may overcome the residual strain.

On the buffer layer 112 and the substrate 111, the growth of the nitride-based semiconductor layer 113 may be sodium flux, ammonothermal, or halide vapor-phase epitaxy (HVPE). Also, carbon is doped in the nitride-based semiconductor layer 113, so as to well-insulate and prevent vertical leakage current.

Figure 3:
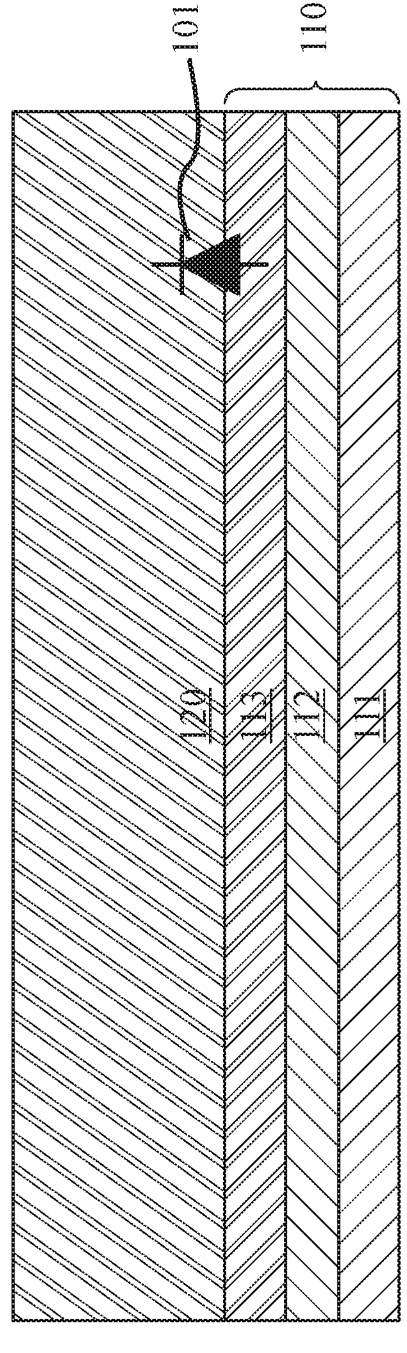
FIG. 3 depicts a side sectional view of another stage of a manufacturing method of nitride-based semiconductor circuit in an embodiment of the present invention.

Referring to FIG. 3, the nitride-based semiconductor layer 120 is disposed on the nitride-based semiconductor carrier 110. The nitride-based semiconductor layer 120 include GaN, and the layer 120 is unintentionally doped GaN. In this embodiment, the nitride-based semiconductor layer 113 has Carbon density of $10^{-19}$ $cm^{-3}$, and the parasitic diode 101 is formed.

Figure 4:
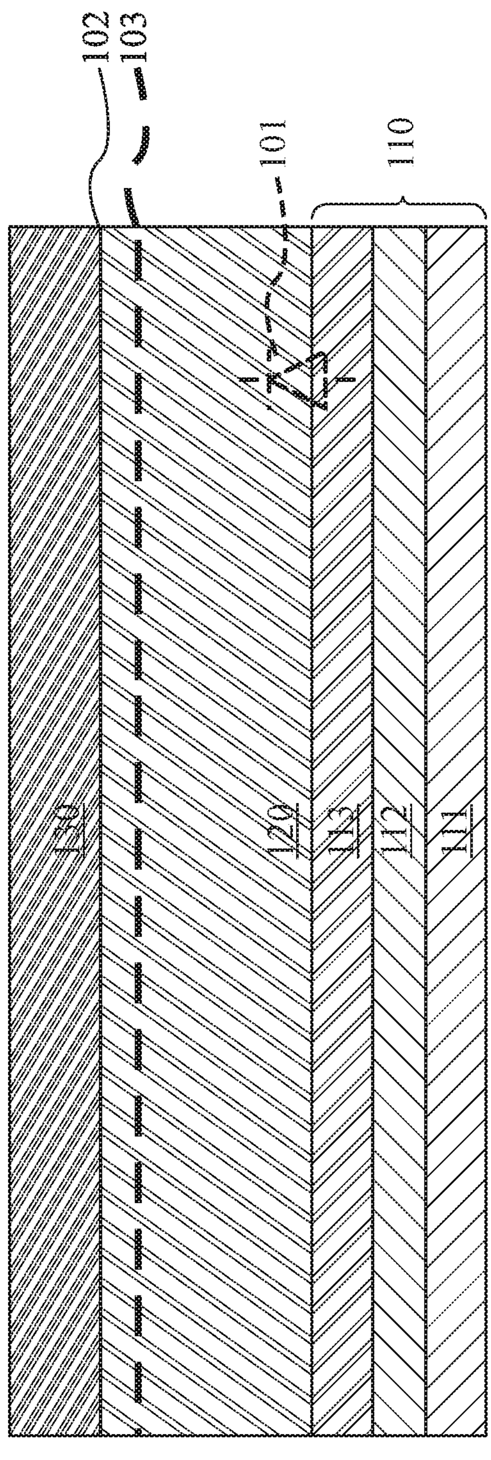
FIG. 4 depicts a side sectional view of another stage of a manufacturing method of nitride-based semiconductor circuit in an embodiment of the present invention.

Referring to FIG. 4, the nitride-based semiconductor layer 130 is disposed on the nitride-based semiconductor layer 120. The nitride-based semiconductor layer 130 includes AlGaN, and the nitride-based semiconductor layers 120, 130 form a heterostructure. The heterojunction 102 is formed between the nitride-based semiconductor layers 120, 130, and the 2DEG 103 is adjacent to the heterojunction 102.

Figure 5:
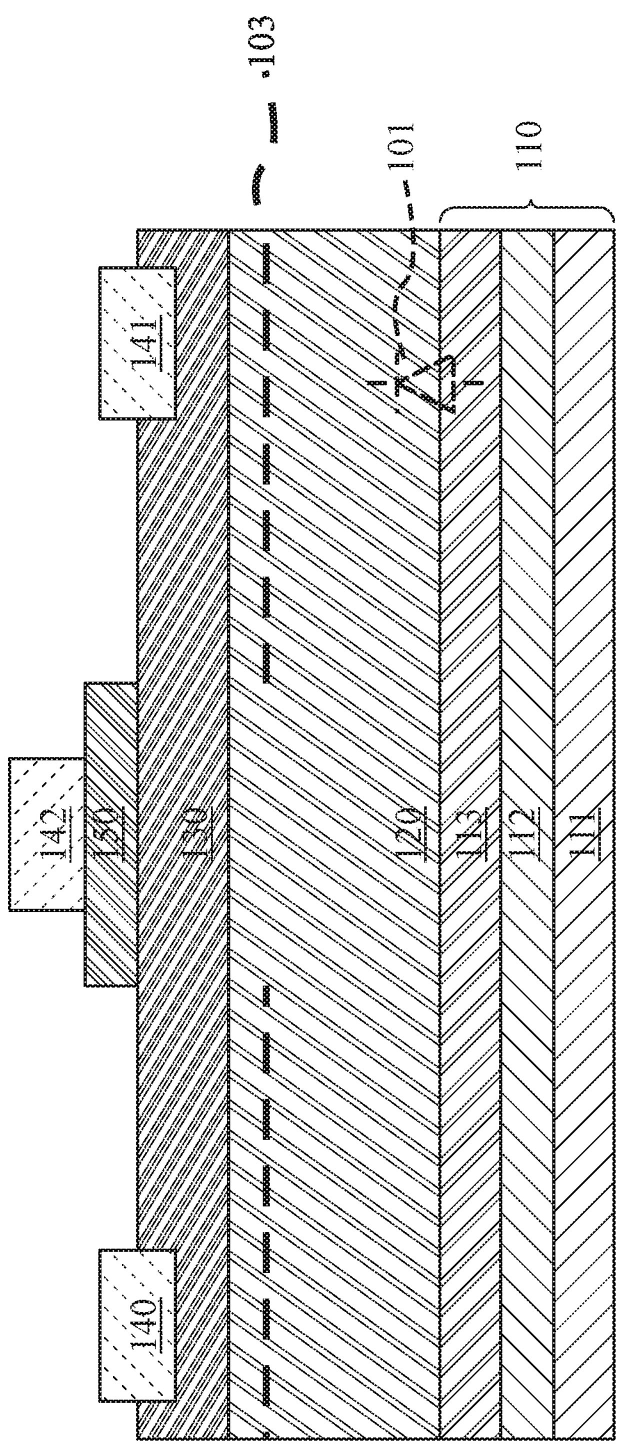
FIG. 5 depicts a side sectional view of another stage of a manufacturing method of nitride-based semiconductor circuit in an embodiment of the present invention.

Referring to FIG. 5, the connectors 140, 141, and 142 are disposed on the nitride-based semiconductor layer 130. A nitride-based semiconductor layer 150 is between the connector 142 and the nitride-based semiconductor layer 130.

The nitride-based semiconductor layer 150 has p-type dopants, and part of the 2DEG 103 is depleted, and a normally-off HEMT structure is formed on the nitride-based semiconductor carrier 110.

Referring to FIG. 1, the manufacturing method electrically connects the connection line 160 to the connector 140, and electrically connects the power supply line 161 to the nitride-based semiconductor carrier 110. The connection line 160 and the power supply line 161 are electrically connected to the power supply 162, and, therefore; the potential difference is applied between the power supply line 161 and the connection line 161. That is, in this nitride-based semiconductor circuit 100A, a potential differential difference is applied between the connector 140 and the nitride-based semiconductor carrier 110.

Figure 6:
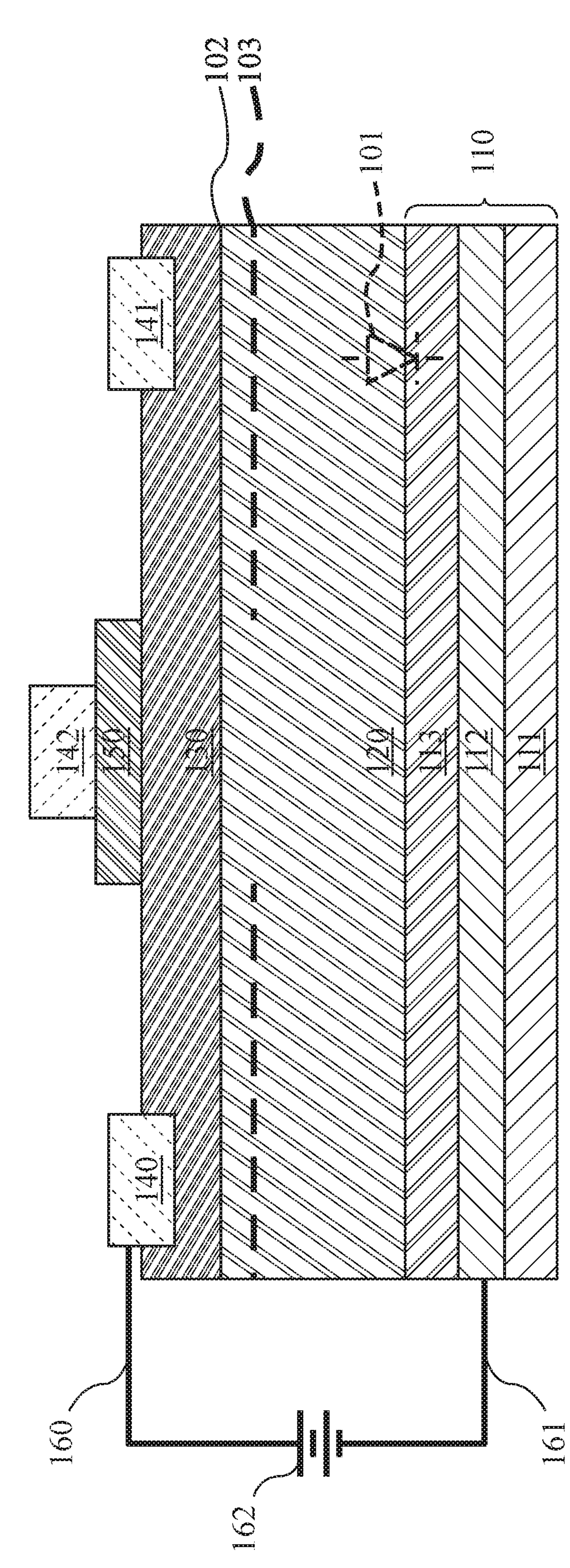
FIG. 6 depicts a side sectional view of a nitride-based semiconductor circuit in another embodiment of the present invention.

FIG. 6 shows a side sectional view of another nitride-based semiconductor circuit 100B of some embodiment of the present invention. The nitride-based semiconductor circuit 100B has a nitride-based semiconductor carrier 110, a nitride-based semiconductor layer 120, and a nitride-based semiconductor layer 130.

The nitride-based semiconductor layer 120 is disposed on the nitride-based semiconductor carrier 110, and the nitride-based semiconductor layer 130 is disposed on the nitride-based semiconductor layer 120.

Connectors 140, 141, and 142 are disposed on the nitride-based semiconductor layer 130, and a nitride-based semiconductor layer 150 is between the connector 142 and the nitride-based semiconductor layer 130. To be specific, the nitride-based semiconductor layer 150 connects the connector 142 and the nitride-based semiconductor layer 130.

Moreover, the nitride-based semiconductor layer 120 may include GaN, and the nitride-based semiconductor layer 120 is non-intentionally doped GaN layer. The nitride-based semiconductor 130 may include AlGaN, and the nitride-based semiconductor layer 130 is grown on the nitride-based semiconductor layer 120. The nitride-based semiconductor layers 120, 130 from a heterostructure, and a heterojunction and a 2DEG 103 is formed. The nitride-based semiconductor layer 150 has p-type dopant, and part of the 2DEG 103 of the heterostructure formed by the nitride-based semiconductor layer 120 and the nitride-based semiconductor layer 130 will be depleted. The nitride-based semiconductor circuit 100B form a HEMT structure, and the HEMT structure includes the connectors 140, 141, and 142, the nitride-based semiconductor layers 150, 130, and 120, and the nitride-based semiconductor carrier 110.

The nitride-based semiconductor carrier 110 has a substrate 111, a buffer layer 112, and a nitride-based semiconductor layer 113. The buffer layer 112 is between the substrate 111 and the nitride-based semiconductor layer 113, and the buffer layer 112 is provided to overcome the problem of residual strain.

The nitride-based semiconductor layer 113 is doped with Carbon to insulate between the substrate 111 and the nitride-based semiconductor layer 120.

In this embodiment, a power line 161 is electrically connected to the buffer layer 112, and a connection line 160 is electrically connected to connector 140. A power supply 162 is connected to both the power line 161 and the connection line 160. Therefore, the power supply 162 can apply potential difference between the buffer layer 112 and the connector 140.

In the nitride-based semiconductor circuit 100B of this embodiment, the connector 140 may be a source connector. While the gate connector (i.e., connector 142) received an electrical signal and resume the 2DEG 103, the connectors 140, 141 will received high voltage signals as well. During the operation, the potential difference applied by the power supply 162 may reduce the dynamic resistance-on peak and issue caused by the dynamic resistance-on peak. In other words, the potential difference is applied through the buffer layer 112 of the nitride-based semiconductor carrier 110 and the connector 140, and the connector 140 works as a source connector of the HEMT structure.

Figure 7:
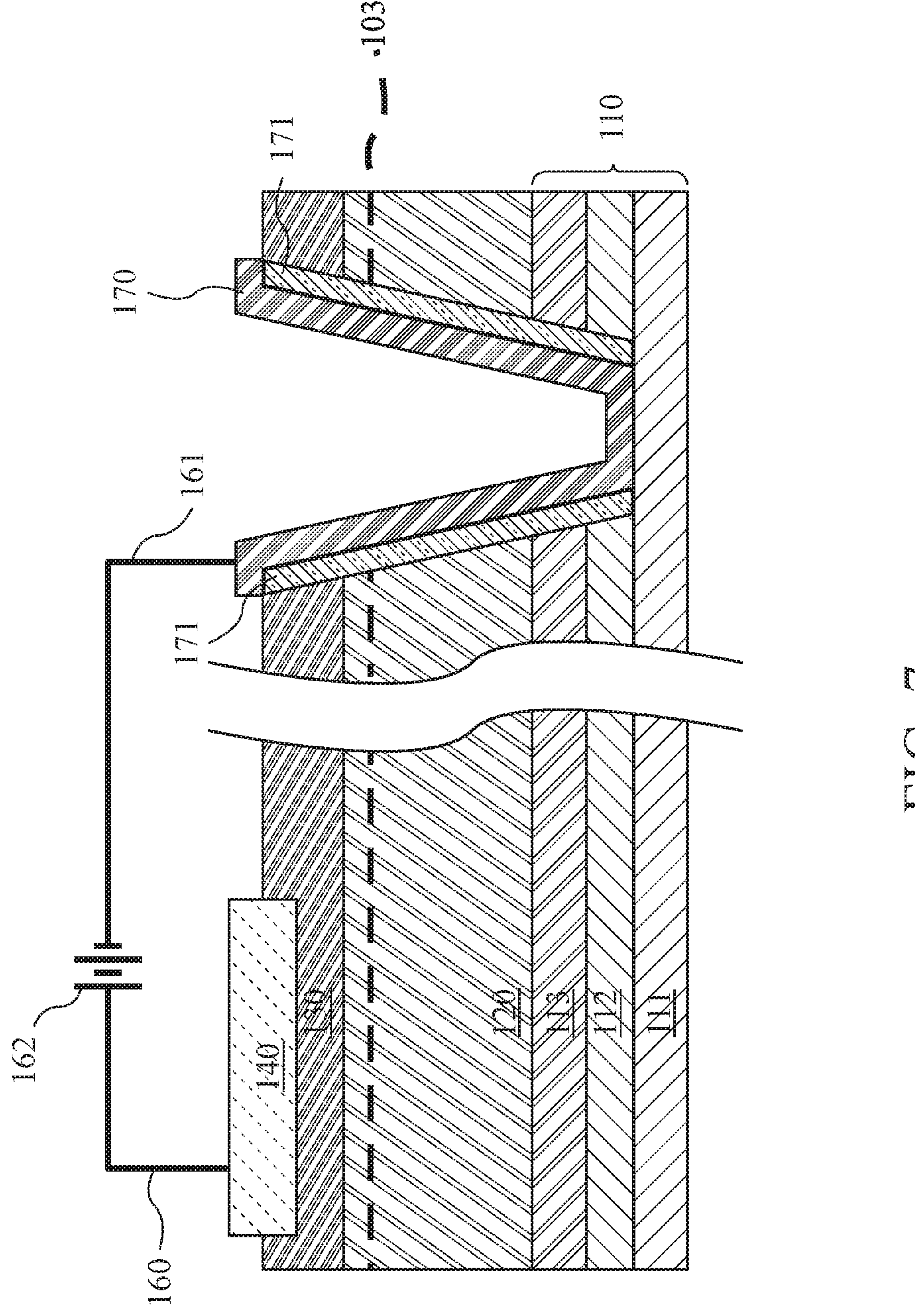

FIG. 7 shows a side sectional view of another nitride-based semiconductor circuit 100C of some embodiment of the present invention. The nitride-based semiconductor circuit 100C has a nitride-based semiconductor carrier 110, a nitride-based semiconductor layer 120, and a nitride-based semiconductor layer 130. The nitride-based semiconductor layer 120 is disposed on the nitride-based semiconductor carrier 110, and the nitride-based semiconductor layer 130 is disposed on the nitride-based semiconductor layer 120. The nitride-based semiconductor carrier 110 has a substrate 111, a buffer layer 112, and a nitride-based semiconductor layer 113, and the buffer layer 112 is between the substrate 111 and the nitride-based semiconductor layer 113.

The nitride-based semiconductor circuit 100C has connector 140 being disposed on the nitride-based semiconductor layer 130, and the connector 140 can be a source connector of a HEMT structure in the nitride-based semiconductor circuit 100C, and the nitride-based semiconductor circuit 100C may have a drain connector, a gate connector as the connectors 141, 142 of the nitride-based semiconductor circuit 100B. The nitride-based semiconductor circuit 100C form a HEMT structure, and the HEMT structure includes the connector 140, the nitride-based semiconductor layers 130, and 120, and the nitride-based semiconductor carrier 110.

In this embodiment, the nitride-based semiconductor circuit 100C has an interconnection 170. The semiconductor circuit 100C has a hole that made through the nitride-based semiconductor layers 113, 120, and 130, and the buffer layer 112, and the interconnection 170 is located in the hole.

The interconnection 170 goes through the nitride-based semiconductor layers 120, 130, and the interconnection 170 electrically connects the nitride-based semiconductor carrier 110. The power supply line 161 electrically connects the interconnection 170 to a terminal of the power supply 162, and a connection line 160 electrically connects the connector 140 to another terminal of the power supply 162. With the power from the power supply 162, a potential difference can be applied on the connector 140 and the nitride-based semiconductor carrier 110.

In other words, the interconnection 170 is a through-GaN vias (TGV). The interconnection 170 may include polysilicon, metal silicide, Titanium nitride, or metals such as Aluminum, Titanium, Tungsten, or the alloy thereof.

The nitride-based semiconductor circuit 100C may also include blocking layers 171. The blocking layers 171 are disposed on the side-wall of the hole where the interconnection 170 is disposed. The blocking layers 171 may stop the diffusion during the process of disposing the interconnection 170. Materials of the blocking layers 171 may include Titanium, Titanium nitride, Tantalum, Tantalum nitride, silicon nitride, or SiCN.

To be specific, in the hole where the interconnection 170 is disposed, the blocking layers 171 of the embodiment cover the side walls of the nitride-based semiconductor layer 130, the nitride-based semiconductor layer 120, the nitride-based semiconductor layer 113, and the buffer layer 112, while exposing the substrate 111.

The negative terminal of the power supply 162 is electrically connected to the substrate 111 of the nitride-based semiconductor carrier 110 through the interconnection 170 and the power supply line 161. The positive terminal of the power supply 162 is electrically connected to the connector 140 through the connection line 160. The power supply 162 applies a potential difference in an area of the nitride-based semiconductor circuit 100C, and the area overlaps an interface between the nitride-based semiconductor layers 113 and 120. If the nitride-based semiconductor layers 113 and 120 form one or more parasitic diodes, the potential difference may prevent the parasitic diode from being strongly reverse biased and affecting the 2DEG 103.

In some embodiment, the concave area in the interconnection 170 may be filled with other metal such as Tungsten. However, the invention is not limited to the material.

FIG. 8 shows a top view of the nitride-based semiconductor circuit 100C, and FIG. 7 is the side sectional view corresponded to the cutting plane line I. In this embodiment, the connectors 140, 141, 142, and the nitride-based semiconductor layer 150 are located in a HEMT area H1, and the interconnection 170 has a width W that is long enough to occupy a side of the HEMT area H1. In this embodiment, the connectors 140, 141, and 142 are arranged along the direction d1, and the interconnection 170 is extended along the direction d1 as well and have the width W.

To be specific, an edge 143 of the connector 140 and an edge 172 of the interconnection 170 are lined up or aligned, and an edge 144 of the connector 141 and another edge 173 of the interconnection 170 are lined up or aligned, and the edges 143, 144, 172, and 173 are parallel. The edges 143, 144, 172, and 173 extend along the same direction, which is perpendicular to the direction d1.

Along direction d1, the HEMT area H1 and the interconnection 170 have the same width W. By applying the potential difference between the connector 140 and the interconnection 170, the 2DEG 103 below the connectors 140, 141, 142 won't be affected by the parasitic diode.

FIG. 9 shows a side sectional view of a nitride-based semiconductor circuit 100D in another embodiment of the present invention. The nitride-based semiconductor circuit 100D has a nitride-based semiconductor carrier 110, a nitride-based semiconductor layers 120, 130, connector 140, and an interconnection 170.

The nitride-based semiconductor layer 120 is disposed on the nitride-based semiconductor carrier 110, and the nitride-based semiconductor layer 130 is disposed on the nitride-based semiconductor layer 120. The nitride-based semiconductor carrier 110 has a substrate 111, a nitride-based semiconductor layer 113, and a buffer layer 112 between the substrate 111 and the nitride-based semiconductor layer 113. The nitride-based semiconductor layer 120 is disposed on the nitride-based semiconductor layer 113.

Due to different bandgaps, the nitride-based semiconductor layers 120 and 130 form a heterostructure and form a 2DEG 103. The nitride-based semiconductor circuit 100D has a HEMT structure, and the HEMT structure includes the connector 140, the nitride-based semiconductor layers 130, and 120, and the nitride-based semiconductor carrier 110. The nitride-based semiconductor circuit 100D may also have connectors that are similar to connectors 141, 142 of nitride-based semiconductor circuit 100C, and the HEMT structure also includes the connectors. Also, the nitride-based semiconductor layer 130, the nitride-based semiconductor layer 120, the nitride-based semiconductor layer 113 form a hole together, and the interconnection 170 is disposed in the hole.

Moreover, the nitride-based semiconductor circuit 100D may include blocking layers 171. The blocking layers 171 are disposed on the side-wall of the hole where the interconnection 170 is disposed. The blocking layers 171 may stop the diffusion during the process of disposing the interconnection 170. Materials of the blocking layers 171 may include Titanium, Titanium nitride, Tantalum, Tantalum nitride, silicon nitride, or SiCN.

To be specific, in the hole where the interconnection 170 is disposed, the blocking layers 171 of the embodiment cover the side walls of the nitride-based semiconductor layer 130, the nitride-based semiconductor layer 120, and the nitride-based semiconductor layer 113, while exposing the buffer layer 112.

A power supply 162 electrically connects the connector 140 and the interconnector 170. A positive terminal of the power supply 162 is electrically connected to the connector 140 through a connection line 160, while the connector 140 is a source connector of the HEMT structure. A negative terminal of the power supply 162 is electrically connected to the buffer layer 112 through the power supply line 161 and the interconnector 170, while the interconnector 170 goes through the nitride-based semiconductor layers 130, 120, and 113.

The power supply 162 applies a potential difference between the buffer layer 112 and the connector 140, and the nitride-based semiconductor layers 113, 120, and 130 are in between them. The nitride-based semiconductor circuit 100D can reduce the dynamic resistance-on peak and issue caused by dynamic resistance-on peak.

FIG. 10 shows a side sectional view of a nitride-based semiconductor circuit 100E in another embodiment of the present invention. The nitride-based semiconductor circuit 100E has a nitride-based semiconductor carrier 110, a nitride-based semiconductor layers 120, 130, connector 140, and an interconnection 170.

The nitride-based semiconductor layer 120 is disposed on the nitride-based semiconductor carrier 110, and the nitride-based semiconductor layer 130 is disposed on the nitride-based semiconductor layer 120. The nitride-based semiconductor carrier 110 has a substrate 111, a nitride-based semiconductor layer 113, and a buffer layer 112 between the substrate 111 and the nitride-based semiconductor layer 113. The nitride-based semiconductor layer 120 is disposed on the nitride-based semiconductor layer 113.

Due to different bandgaps, the nitride-based semiconductor layers 120 and 130 form a heterostructure and form a 2DEG 103. The nitride-based semiconductor circuit 100E has a HEMT structure, and the HEMT structure includes the connector 140, the nitride-based semiconductor layers 130, and 120, and the nitride-based semiconductor carrier 110. The nitride-based semiconductor circuit 100D may also have connectors that are similar to connectors 141, 142 of nitride-based semiconductor circuit 100C, and the HEMT structure also includes the connectors. Also, the nitride-based semiconductor layers 120, 130 form a hole together, and the interconnection 170 is disposed in the hole.

Moreover, the nitride-based semiconductor circuit 100E may include blocking layers 171. The blocking layers 171 are disposed on the side-wall of the hole where the interconnection 170 is disposed. The blocking layers 171 may stop the diffusion during the process of disposing the interconnection 170. Materials of the blocking layers 171 may include Titanium, Titanium nitride, Tantalum, Tantalum nitride, silicon nitride, or SiCN.

To be specific, in the hole where the interconnection 170 is disposed, the blocking layers 171 of the embodiment cover the side walls of the nitride-based semiconductor layer 130, and the nitride-based semiconductor layer 120, while exposing the nitride-based semiconductor layer 113.

A power supply 162 electrically connects the connector 140 and the interconnector 170. A positive terminal of the power supply 162 is electrically connected to the connector 140 through a connection line 160, while the connector 140 is a source connector of an HEMT structure. A negative terminal of the power supply 162 is electrically connected to the nitride-based semiconductor layer 113 through the power supply line 161 and the interconnector 170, while the interconnector 170 goes through the nitride-based semiconductor layers 130, and 120.

The power supply 162 applies a potential difference between the nitride-based semiconductor layer 113 and the connector 140, and the power supply 162 controls the potential of the nitride-based semiconductor layers 113 directly. Therefore, the nitride-based semiconductor circuit 100E can reduce the dynamic resistance-on peak and issue caused by dynamic resistance-on peak.

In the embodiments of nitride-based semiconductor circuits 100E, and 100D, the layout of the connector 140 and the interconnection 170 may similar to the nitride-based semiconductor circuits 100C in FIG. 8.

FIG. 11 shows a top view of nitride-based semiconductor circuits of some embodiments of the present invention. In some embodiment, layout of the nitride-based semiconductor circuits 100C, 100D, 100E may be similar to FIG. 11. The nitride-based semiconductor circuit might have an interconnector 174 and the interconnector 170. An edge 175 of the interconnector 174 and the edge 143 of the connector 140, which is facing backward towards the connector 142, are lined up or aligned. Another edge 176 of the interconnector 174 and an edge 152 of the nitride-based semiconductor layer 150, which is facing towards the connector 141, are lined up or aligned.

Also, the edge 172 of the interconnector 170 and another edge 151 of the nitride-based semiconductor layer 150, which is facing towards the connector 140, are lined up or aligned. The edge 173 of the interconnector 170 and the edge 144 of the connector 141, which is facing backwards towards the connector 142, are lined up or aligned.

The interconnectors 170, 174 are electrically connected to the power supply 162 through the power supply lines 161, 163 respectively, and the connector 140 is connected to the power supply 162. The interconnector 170 may specifically reduce the reverse bias of the parasitic diode under the nitride-based semiconductor layer 150 and the connector 141, and reduce the effect of the 2DEG under thereof. The interconnector 174 may specifically reduce the reverse bias of the parasitic diode under the nitride-based semiconductor layer 150 and the connector 140, and reduce the effect of the 2DEG under thereof. In other words, both the interconnectors 170, 174 can reduce the reverse bias under the nitride-based semiconductor layer 150.

In some other embodiments of the present invention, the nitride-based semiconductor circuit may only include one of the interconnectors 170, 174.

FIG. 12 shows a side sectional view of a nitride-based semiconductor circuit 100F in another embodiment of the present invention. The nitride-based semiconductor circuit 100F has a nitride-based semiconductor carrier 110, a nitride-based semiconductor layer 120, and a nitride-based semiconductor layer 130. The nitride-based semiconductor layer 120 is disposed on the nitride-based semiconductor carrier 110, and the nitride-based semiconductor layer 130 is disposed on the nitride-based semiconductor layer 120. Due to different bandgaps, the nitride-based semiconductor layers 120 and 130 form a heterostructure and form a 2DEG 103. The nitride-based semiconductor circuit 100F form a HEMT structure, and the HEMT structure includes the connector 140, the nitride-based semiconductor layers 130, and 120, and the nitride-based semiconductor carrier 110.

In this embodiment, the nitride-based semiconductor circuit 100F has a conductive layer 180. The nitride-based semiconductor carrier 110 has a substrate 111, a nitride-based semiconductor layer 113, and a buffer layer 112 between the substrate 111 and the nitride-based semiconductor layer 113. The substrate 111 is disposed on the conductive layer 180.

In the nitride-based semiconductor circuit 100F, a hole goes through the nitride-based semiconductor layers 130, 120, 113, the buffer layer 112, and the substrate 111, and the hole exposes the conductive layer 180 under the substrate 111. A connector 140 is disposed on the nitride-based semiconductor layer 130, and an interconnector 170 is disposed in the hole. A positive terminal of the power supply 162 electrically connects the connector 140 through a connection line 160, and a negative terminal of the power supply 162 electrically connects the conductive layer 180 through a power supply line 161 and the interconnector 170. To be specific, an edge of the conductive layer 180 and an edge of the bottom part of the interconnector 170 coincide.

Moreover, the nitride-based semiconductor circuit 100F may include blocking layers 171. The blocking layers 171 are disposed on the side-wall of the hole where the interconnection 170 is disposed. The blocking layers 171 may stop the diffusion during the process of disposing the interconnection 170. Materials of the blocking layers 171 may include Titanium, Titanium nitride, Tantalum, Tantalum nitride, silicon nitride, or SiCN.

To be specific, in the hole where the interconnection 170 is disposed, the blocking layers 171 of the embodiment cover the side walls of the nitride-based semiconductor layers 130, 120, 113, the buffer layer 112, and the substrate 111, while exposing the conductive layer 180.

The power supply 162 provides a potential difference on the connector 140 and the conductive layer 180. The nitride-based semiconductor layer 120 is an unintentionally doped layer, and the nitride-based semiconductor layer 113 has p-type dopant. Therefore, the potential difference provided by the power supply 162 can reduce the reverse bias of the parasitic diode.

FIG. 13 shows a top view of the nitride-based semiconductor circuit 100F. In this embodiment, the projections of the connectors 140, 141 on the substrate 111 are within a projection A1 of the conductive layer 180 on the substrate 111. The connector 140 can be a source connector, and the connector 141 can be a drain connector.

Moreover, the projections of the connector 142 and the nitride-based semiconductor layer 150 are within the projection A1 of the conductive layer 180. The connector 142 can be a gate connector, and the nitride-based semiconductor layer 150 is a p-type doped nitride-based semiconductor layer.

FIG. 14 shows a side sectional view of a nitride-based semiconductor circuit 100G. The nitride-based semiconductor circuit 100G has a conductive layer 180, a nitride-based semiconductor carrier 110, a nitride-based semiconductor layer 120, and a nitride-based semiconductor layer 130. The nitride-based semiconductor carrier 110 is disposed on the conductive layer 180, and the nitride-based semiconductor layer 120 is disposed on the nitride-based carrier 110, and the nitride-based semiconductor layer 130 is disposed on the nitride-based semiconductor layer 120.

The nitride-based semiconductor carrier 110 has a substrate 111, a buffer layer 112, and a nitride-based semiconductor layer 113. The nitride-based semiconductor layer 120 is disposed on the nitride-based semiconductor layer 113, and the substrate 111 is disposed on the conductive layer 180.

A power supply 162 is electrically connected to the connector 140 on the nitride-based semiconductor layer 130 and the conductive layer 180 under the substrate 111. To be specific, a positive terminal of the power supply 162 electrically connects the connector 140 through a connection line 160, and a negative terminal of the power supply 162 electrically connects the conductive layer 180 through a power supply line 161.

The nitride-based semiconductor layer 120 may be an unintentionally doped GaN layer, and the nitride-based semiconductor layer 130 may be an AlGaN layer. Due to different band gaps, a 2DEG 103 is formed. The nitride-based semiconductor layer 113 may be a GaN layer with p-type dopant, and parasitic diode may form between the nitride-based semiconductor layers 113, 120.

The power supply 162 applies a potential difference to the conductive layer 180 and the connector 140, and the connector 140 can be a source connector of a HEMT structure. The nitride-based semiconductor circuit 100G form the HEMT structure, and the HEMT structure includes the connectors 140, 141, and 142, the nitride-based semiconductor layers 150, 130, and 120, and the nitride-based semiconductor carrier 110. Therefore, the potential difference can reduce the reverse bias of the parasitic diode formed by the nitride-based semiconductor layers 113 and 120.

FIG. 15 shows a top view of the nitride-based semiconductor circuit 100G. In this embodiment, the projections of the connectors 140, and 141 on the substrate 111 are within a projection A2 of the conductive layer 180 on the substrate 111. Moreover, the projections of the nitride-based semiconductor layer 150 and the connector 142 are within a projection A2 of the conductive layer 180 on the substrate 111. The connector 141 can be a drain connector of a HEMT structure, and the connector 142 can be a gate connector of the HEMT structure. Therefore, the power supply 162 can prevent the 2DEG 103 of the HEMT structure from affecting by the parasitic diode.

FIG. 16 shows a top view of a nitride-based semiconductor circuit 100H in another embodiment of the present invention. The nitride-based semiconductor circuit 100H is similar to the nitride-based semiconductor circuit 100G. The difference is that the projection A3 of the conductive layer on the substrate is corresponded to the connector 142 and the nitride-based semiconductor layer 150 under the connector 142. The projections of the connector 142 and the nitride-based semiconductor layer 150, which may include p-type dopants, are within the projection A3, and the connector 142 may be gate connector of a HEMT structure. The power supply 162 electrically connects to the connector 140 and the conductive layer through the connection line 160 and the power supply line 161, and the connector 140 can be a source connector of the HEMT structure, while the connector 141 can be a drain connector of the HEMT structure.

The nitride-based semiconductor circuit 100H may improve the 2DEG specifically under the connector 142 and the nitride-based semiconductor layer 150, and the depletion of the 2DEG won't be affected by the parasitic diode.

FIG. 17 shows a circuit diagram of the nitride-based semiconductor circuit 100I. The nitride-based semiconductor has a HEMT structure 102, and the HEMT structure 102 is similar to the HEMT structure of the nitride-based semiconductor circuit 100A. In some embodiment, the HEMT structure 102 can be similar to the HEMT structures of the nitride-based semiconductor circuit 100B, 100C, 100D, 100E, 100F, 100G.

The nitride-based semiconductor circuit 100I has a power source 163. The power source 163 is electrically connected to the power supply line 161 and the connection line 160. The power supply line 161 is electrically connected to the nitride-based semiconductor carrier of the HEMT structure 102, and the connection line 160 is electrically connected to the source connector of the HEMT structure 102.

The power source 163 is a direct current power, and a potential difference is applied between the source connector of the HEMT structure 102 and the nitride-based semiconductor carrier of the HEMT structure 102. The power source 163 can reduce the reverse bias of the parasitic diode in the HEMT structure 102 with direct current.

FIG. 18 shows a circuit diagram of a nitride-based semiconductor circuit 100J in another embodiment of the present invention. The nitride-based semiconductor circuit 100J has a HEMT structure 102, a power source 163, and an inverter 164 (i.e., NOT gate). The inverter 164 is electrically connected to the power supply line 161, and the inverter 164 and the connection line 160 connect to the power source 163. The HEMT structure 102 is similar to the HEMT structure of the nitride-based semiconductor circuit 100A. In some embodiment, the HEMT structure 102 can be similar to the HEMT structures of the nitride-based semiconductor circuit 100*n*, 100C, 100D, 100E, 100F, 100G. The input of the inverter 164 and the connection line 160 are both connected to the same terminal of the power source 163, and the output of the inverter is connected to the nitride-based semiconductor carrier of the HEMT structure 102.

The power source 163 may be a DC power source, and it can provide a potential difference with the inverter. The power source 163 and the inverter 164 can reduce the reverse bias of the parasitic diode in the HEMT structure 102 with direct current.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 m, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor circuit, comprising:

a nitride-based semiconductor carrier;

a first nitride-based semiconductor layer disposed over the semiconductor carrier;

a second nitride-based semiconductor layer disposed on the first nitride-based semiconductor layer;

a source connector disposed on the second nitride-based semiconductor layer;

a gate connector disposed on the second nitride-based semiconductor layer;

a drain connector disposed on the second nitride-based semiconductor layer;

a connection line electrically connected to the source connector;

a power supply line electrically connected to the nitride-based semiconductor carrier; and one or more interconnections, wherein the interconnections go through the first nitride-based semiconductor layer, and the second nitride-based semiconductor layer, and electrically connect the nitride-based semiconductor carrier, the power supply line is electrically connected to the interconnections, and orthographic projections of the interconnections onto the nitride-based semiconductor carrier do not overlap with orthographic projections of the source connector, the gate connector, and the drain connector onto the nitride-based semiconductor carrier, wherein a heterojunction is formed between the first and the second nitride-based semiconductor layers, and the gate connector is located between the source connector and the drain connector, and a potential difference is applied between the power supply line and the connection line, such that the potential difference is applied between the source connector and the nitride-based semiconductor carrier, wherein the nitride-based semiconductor carrier comprises:

a substrate;

a buffer layer disposed on the substrate; and a third nitride-based semiconductor layer disposed on the buffer layer, and the third nitride-based semiconductor layer is doped with p-type dopant, and wherein the interconnection is electrically connected to the substrate.

2. The nitride-based semiconductor circuit of claim 1, wherein the p-type dopant is carbon.

3. The nitride-based semiconductor circuit of claim 1, wherein the power supply line is electrically connected to the substrate.

4. The nitride-based semiconductor circuit of claim 1, wherein the third nitride-based semiconductor layer and the first nitride-based semiconductor layer form one or more parasitic diodes, and the potential difference biases the parasitic diodes.

5. The nitride-based semiconductor circuit of claim 1, wherein the nitride-based semiconductor carrier further comprises a conductive layer, and the substrate is disposed on the conductive layer, and the interconnection is electrically connected to the conductive layer.

6. The nitride-based semiconductor circuit of claim 5, wherein projections of the source connector and the drain connector on the substrate are within a projection of the conductive layer on the substrate.

7. The nitride-based semiconductor circuit of claim 1, wherein the nitride-based semiconductor carrier further comprises a conductive layer, and the substrate is disposed on the conductive layer, and the power supply line is electrically connected to the conductive layer.

8. The nitride-based semiconductor circuit of claim 1, wherein the power supply line is electrically connected to a negative voltage of a power supply, and the connection line is electrically connected to a positive voltage of the power supply.

9. The nitride-based semiconductor circuit of claim 1 further comprising an inverter, wherein the inverter is electrically connected to the power supply line, and the inverter and the connection line connect to a power source.

10. A manufacturing method of nitride-based semiconductor circuit, comprising:

providing a nitride-based semiconductor carrier;

disposing a first nitride-based semiconductor layer on the nitride-based semiconductor carrier;

disposing a second nitride-based semiconductor layer on the first nitride-based semiconductor layer;

disposing a source connector, a gate connector, and a drain connector on the second nitride-based semiconductor layer;

disposing one or more interconnections, wherein the interconnections go through the first nitride-based semiconductor layer, and the second nitride-based semiconductor layer, and electrically connect the nitride-based semiconductor carrier, and orthographic projections of the interconnections onto the nitride-based semiconductor carrier do not overlap with orthographic projections of the source connector, the gate connector, and the drain connector onto the nitride-based semiconductor carrier;

electrically connecting the source connector with a connection line;

electrically connecting the nitride-based semiconductor carrier with a power supply line via the interconnections; and applying a potential differential difference between the power supply line and the connection line, such that the potential difference is applied between the source connector and the nitride-based semiconductor carrier, wherein a heterojunction is formed between the first and second nitride-based semiconductor layers, and the gate connector is located between the source connector and the drain connector, wherein the nitride-based semiconductor carrier comprises:

a substrate;

a buffer layer disposed on the substrate; and a third nitride-based semiconductor layer disposed on the buffer layer, and the third nitride-based semiconductor layer is doped with p-type dopant, and wherein the interconnection is electrically connected to the substrate.

11. The manufacturing method of claim 10, wherein the power supply line provides a negative voltage while the drain connector is at high voltage.

12. The manufacturing method of claim 10, wherein the third nitride-based semiconductor layer and the first nitride-based semiconductor layer form one or more parasitic diodes.

13. The manufacturing method of claim 10, wherein the power supply line is electrically connected to the nitride-based semiconductor carrier through a conductive layer.

14. The nitride-based semiconductor circuit of claim 1, wherein the source connector, the gate connector, and the drain connector are arranged at intervals in sequence along a first direction, and the orthographic projections of the source connector and the drain connector onto the nitride-based semiconductor carrier have a first edge and a second edge that face away from the orthographic projection of the gate connector onto the nitride-based semiconductor carrier, respectively, and wherein the orthographic projections of the interconnections onto the nitride-based semiconductor carrier extend along the first direction, and have a third edge and a fourth edge that are aligned with the first edge and the second edge along a second direction, respectively, wherein the first direction and the second direction are perpendicular to each other.

15. A nitride-based semiconductor circuit, comprising:

a nitride-based semiconductor carrier;

a first nitride-based semiconductor layer disposed over the semiconductor carrier;

a second nitride-based semiconductor layer disposed on the first nitride-based semiconductor layer;

a source connector disposed on the second nitride-based semiconductor layer;

a gate connector disposed on the second nitride-based semiconductor layer;

a drain connector disposed on the second nitride-based semiconductor layer;

a connection line electrically connected to the source connector;

a power supply line electrically connected to the nitride-based semiconductor carrier; and one or more interconnections, wherein the interconnections go through the first nitride-based semiconductor layer, and the second nitride-based semiconductor layer, and electrically connect the nitride-based semiconductor carrier, the power supply line is electrically connected to the interconnections, and orthographic projections of the interconnections onto the nitride-based semiconductor carrier do not overlap with orthographic projections of the source connector, the gate connector, and the drain connector onto the nitride-based semiconductor carrier, wherein a heterojunction is formed between the first and the second nitride-based semiconductor layers, and the gate connector is located between the source connector and the drain connector, and a potential difference is applied between the power supply line and the connection line, such that the potential difference is applied between the source connector and the nitride-based semiconductor carrier, wherein the source connector, the gate connector, and the drain connector are arranged at intervals in sequence along a first direction, and the orthographic projections of the source connector and the drain connector onto the nitride-based semiconductor carrier have a first edge and a second edge that face away from the orthographic projection of the gate connector onto the nitride-based semiconductor carrier, respectively, and wherein the orthographic projections of the interconnections onto the nitride-based semiconductor carrier extend along the first direction, and have a third edge and a fourth edge that are aligned with the first edge and the second edge along a second direction, respectively, wherein the first direction and the second direction are perpendicular to each other.

16. The nitride-based semiconductor circuit of claim 15, wherein the nitride-based semiconductor carrier comprises:

a substrate;

a buffer layer disposed on the substrate; and a third nitride-based semiconductor layer disposed on the buffer layer, and the third nitride-based semiconductor layer is doped with p-type dopant.

17. The nitride-based semiconductor circuit of claim 16, wherein the interconnection is electrically connected to the substrate.

18. The nitride-based semiconductor circuit of claim 16, wherein the interconnection is electrically connected to the buffer layer.

19. The nitride-based semiconductor circuit of claim 16, wherein the interconnection is electrically connected to the third nitride-based semiconductor layer.

20. The nitride-based semiconductor circuit of claim 16, wherein the nitride-based semiconductor carrier further comprises a conductive layer, and the substrate is disposed on the conductive layer, and the interconnection is electrically connected to the conductive layer.

* * * * *